US008773928B2

(12) United States Patent
Morgan

(10) Patent No.: US 8,773,928 B2
(45) Date of Patent: *Jul. 8, 2014

(54) COMMAND LATENCY SYSTEMS AND METHODS

(71) Applicant: Micron Technology, Inc., Boise, ID (US)

(72) Inventor: Donald M. Morgan, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/915,351

(22) Filed: Jun. 11, 2013

(65) Prior Publication Data

US 2013/0272079 A1    Oct. 17, 2013

Related U.S. Application Data

(63) Continuation of application No. 13/331,932, filed on Dec. 20, 2011, now Pat. No. 8,462,568, which is a continuation of application No. 12/500,240, filed on Jul. 9, 2009, now Pat. No. 8,094,507.

(51) Int. Cl.
*G11C 27/04* (2006.01)

(52) U.S. Cl.
USPC ............ 365/194; 365/233.1; 365/233.11; 365/233.12

(58) Field of Classification Search
USPC ............ 365/194, 233.1, 233.11, 233.12
See application file for complete search history.

(56) References Cited

U.S. PATENT DOCUMENTS

| 6,188,640 B1 | 2/2001 | Aikawa et al. |
| 8,094,507 B2 | 1/2012 | Morgan |
| 8,462,568 B2 | 6/2013 | Morgan |
| 2004/0095838 A1 | 5/2004 | Li |
| 2004/0264230 A1* | 12/2004 | Brand et al. ................. 365/145 |
| 2005/0122795 A1 | 6/2005 | Fujisawa et al. |
| 2007/0291576 A1 | 12/2007 | Yang |
| 2008/0111596 A1 | 5/2008 | Lee |
| 2009/0016146 A1 | 1/2009 | Fujisawa |
| 2009/0290445 A1 | 11/2009 | Kinoshita et al. |
| 2011/0007587 A1 | 1/2011 | Morgan |
| 2012/0092945 A1 | 4/2012 | Morgan |

FOREIGN PATENT DOCUMENTS

| EP | 1779251 B1 | 7/2009 |
| WO | WO-2006/023360 A1 | 3/2006 |

* cited by examiner

*Primary Examiner* — Huan Hoang
*Assistant Examiner* — Jay Radke
(74) *Attorney, Agent, or Firm* — Dorsey & Whitney LLP

(57) ABSTRACT

Examples of command latency systems and methods are described. In some examples, phase information associated with a received command signal is stored, a received command signal is propagated through a reduced clock flip-flop pipeline and the delayed command signal is combined with the stored phase information. The reduced clock flip-flop pipeline may use a clock having a lower frequency than that used to issue the command signal. Accordingly, fewer flip-flops may be required.

20 Claims, 8 Drawing Sheets

COMMAND LATENCY SYSTEMS AND METHODS

CROSS REFERENCE TO RELATED APPLICATION(S)

This application is a continuation of U.S. patent application Ser. No. 13/331,932, filed Dec. 20, 2011, and issued as U.S. Pat. No. 8,462,568 on Jun. 11, 2013, which application is a continuation of U.S. patent application Ser. No. 12/500,240, filed Jul. 9, 2009, and issued as U.S. Pat. No. 8,094,507 on Jan. 10, 2012. These applications and patents are incorporated herein by reference, in their entirety, for any purpose.

TECHNICAL FIELD

Embodiments of the invention relate generally to semiconductor memory, and particularly, to latency and the delay of memory commands.

BACKGROUND OF THE INVENTION

Circuitry may be used in memory systems to delay received commands and addresses for a number of clock cycles. For example, a memory array may include memory cells arranged in rows and columns. A row address, and accompanying row address strobe signal (/RAS) may be coupled to the array and the corresponding row activated. A column address, and accompanying column address strobe signal (/CAS) may be coupled to the array to read data out of (or write data to) a particular column of the activated row. It may take time for the selected row to be activated, and the column address strobe signal should not be received until the activation is complete. Accordingly, it may be desirable to delay the column address strobe signal, the column address, or both, from the time they are received by the memory system to a later time when they may be applied to the memory array with increased confidence that the row will be activated.

Accordingly, an example of a pipeline 100 for delaying a command is shown in FIG. 1. The pipeline 100 includes fifteen flip-flops 110a-110o. Each of the flip-flops 110a-110o includes an input node, an output node, a first and second clock node, and a reset node. A command, CmdQd, may be received at the input node of the flip-flop 110a and latched using a clock signal T1Clk applied to the flip-flop 110a at the first clock node. The complementary clock signal T1Clkf may be applied to the flip-flop 110a at the second clock node, and a reset signal RST applied to the flip-flop 110a at the reset node to control operation of the flip-flop 110a. Accordingly the flip-flop 110a may output Cmd<1>, a delayed version of the signal CmdQd.

The Cmd<1> signal may be input to the next flip-flop 110b, controlled using a local clock signal LCK. The flip-flops 110b-110o are controlled such that each flip-flop stores the received command signal for one cycle of the LCK signal. In this manner, the command is stored in the flip-flop 110b during one LCK cycle, then stored in the flip-flop 110c during a next LCK cycle, then stored in the flip-flop 110d during a next LCK cycle, and so on. Using the fifteen flip-flops 110a-110o shown in FIG. 1, the final output Cmd<15> may be delayed fifteen clock cycles from the original input CmdQd, satisfying a latency specification of 15.

In this manner, command latency may be achieved by providing a pipeline having a number of flip-flop stages equal to the latency desired.

DETAILED DESCRIPTION

Certain details are set forth below to provide a sufficient understanding of embodiments of the invention. However, it will be clear to one skilled in the art that embodiments of the invention may be practiced without various of these particular details. In some instances, well-known circuits, control signals, timing protocols, and software operations have not been shown in detail in order to avoid unnecessarily obscuring the described embodiments of the invention.

Figure 2:
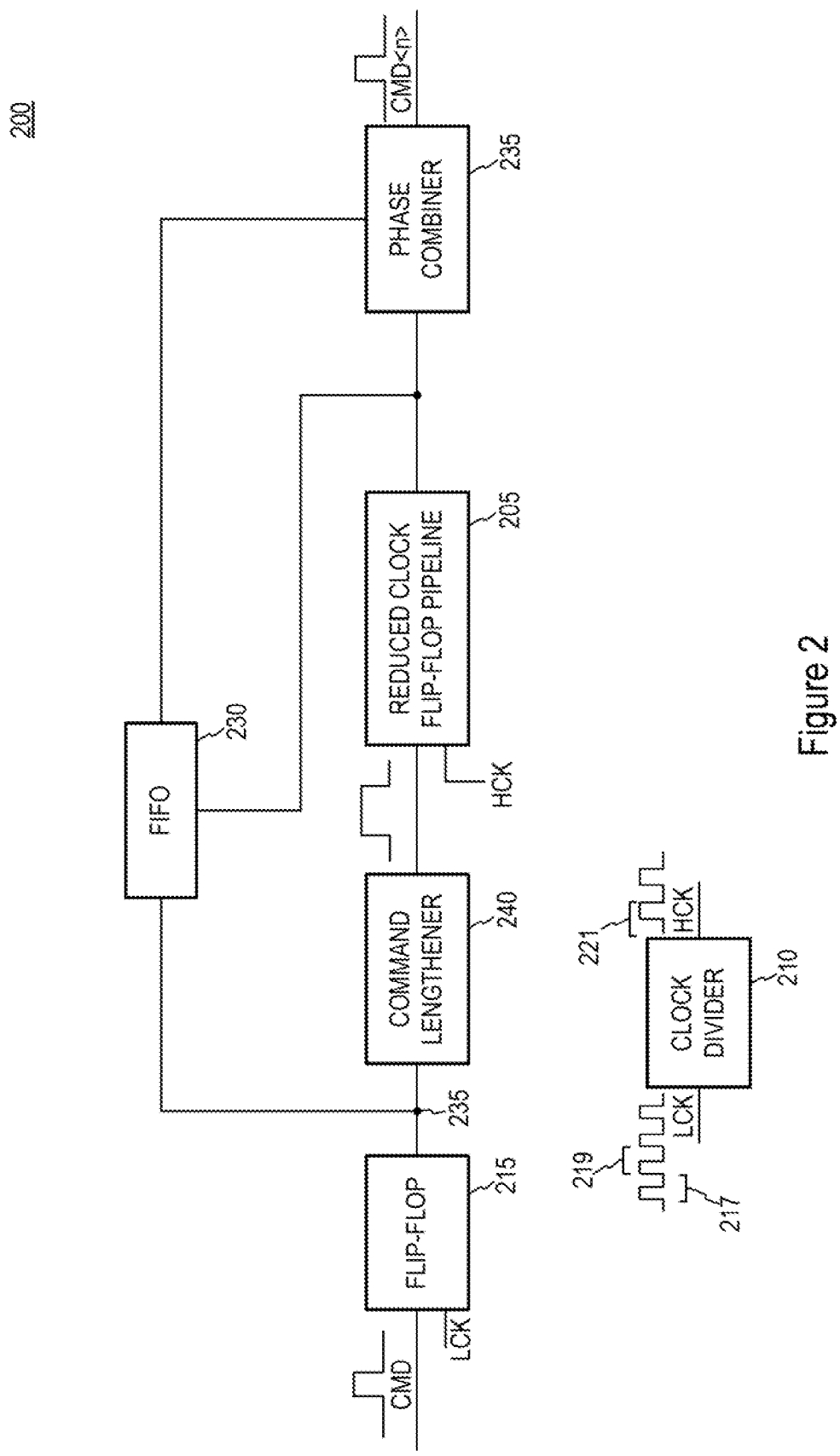
FIG. 2 is a schematic illustration of a command latency system according to an embodiment of the present invention.

FIG. 2 depicts a command latency system 200 according to an embodiment of the present invention. The latency system 200 includes a reduced clock flip-flop pipeline 205 that may delay a received command signal using a plurality of flip-flops coupled in series. Each flip-flop is clocked using a clock signal HCK. The clock signal HCK may be generated by a clock divider 210 which receives the local clock signal LCK, and generates a slower HCK signal based in part on the LCK signal. The HCK signal may have ½ the frequency of the LCK signal, or ¼, or some other lower frequency than the LCK signal.

Figure 1:
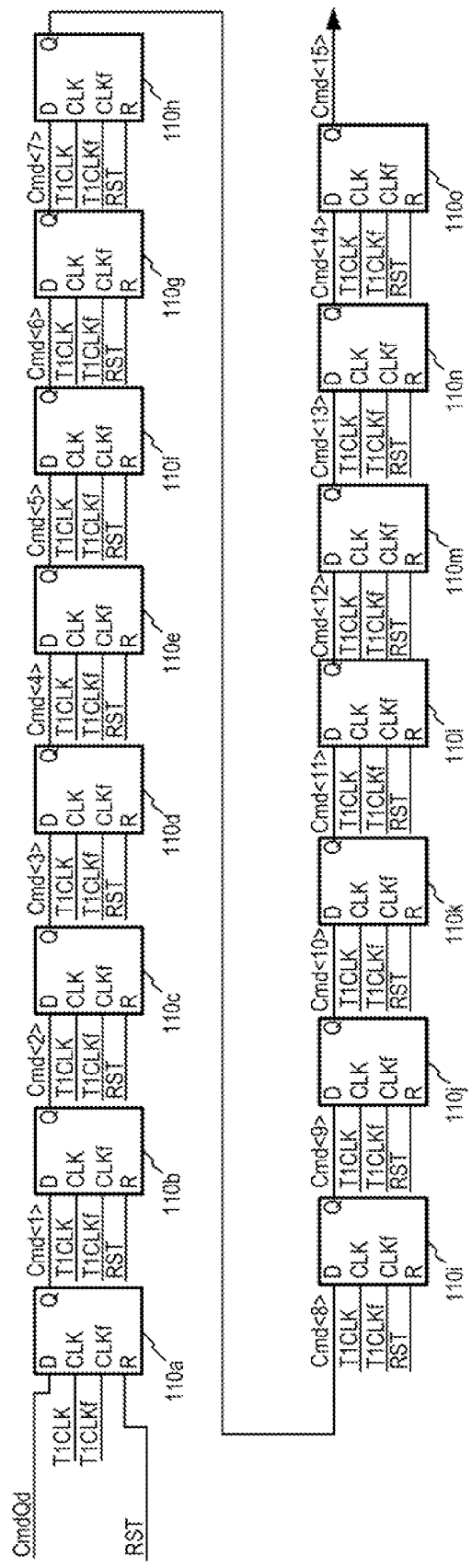
FIG. 1 is a schematic illustration of an example of a pipeline for delaying a command in accordance with the prior art.

Recall, as described above with reference to FIG. 1, a flip-flop pipeline may store a received command in each flip-flop for a clock cycle of the clock applied to the flip-flop. By utilizing a slower clock signal in the reduced clock flip-flop pipeline 205 in FIG. 2, each flip-flop may store the command for a longer period of time when the HCK signal is used to clock the pipeline 205. Because each flip-flop stores the signal for a longer period of time, fewer flip-flops may be needed to delay a received command for a particular amount of time. Utilizing fewer flip-flops for a given latency may save complexity and power. As clock speeds in memory systems increase, an increasing number of clock cycles may be required to meet latency specifications. Using the pipeline of FIG. 1, this would require an increasing number of flip-flops. In some embodiments, the number of flip-flops may be reduced using a system according to the present invention, such as the command latency system 200.

Accordingly, the reduced clock flip-flop pipeline 205 may delay a command signal utilizing a reduced number of flip-flop stages. However, the delayed command signal may be applied to a memory array according to cycles of the local clock signal, LCK, but the command signal had propagated through the reduced clock flip-flop pipeline 205 according to the slower clock signal HCK. A cycle of the HCK signal may be longer than a cycle of the LCK signal, and may be as long as two or four LCK signal cycles. Accordingly, it may be necessary in some examples to identify which of the LCK signal cycles corresponding to a single HCK cycle the command signal arrived on, and accordingly, should be used to apply the delayed command signal to the array. For example, referring to the LCK signal in FIG. 2 shown entering the clock divider 210 in an example where the HCK signal has ½ the frequency of the LCK signal, a command may arrive during a first cycle 217 or a second cycle 219 of the LCK signal. In either case, the command may propagate through the reduced clock flip-flop pipeline beginning with the HCK cycle 221. Accordingly, a command that arrived during the cycle 217 may be propagated through the reduced clock flip-flop pipeline 205 in the same manner as a command that arrived during the cycle 219. It may be necessary however, to identify which of the multiple LCK cycles associated with a single HCK cycle the command data was received during, such that the delayed command can be paired with a corresponding LCK cycle and coupled to a memory array.

Accordingly, a first-in first-out memory (FIFO) 230 is coupled to store phase information for received command signals. While a FIFO is shown, in some embodiments other storage circuitry may be used. Once the command signals are passed through the reduced clock flip-flop pipeline 205, a phase combiner 235 utilizes stored information from the FIFO 230 to output the delayed command signal during an LCK signal cycle specified by the stored phase information.

Having described examples of the purpose of portions of the system 200—to store phase information associated with a received command signal, delay a received command signal through a reduced clock flip-flop pipeline, and combine the delayed command signal with the stored phase information—operation of the system 200 will now be described by following a command signal through the system, and utilizing an example where the HCK signal has a frequency that is ½ of the LCK signal. The ½ frequency relationship is used as an example, and other frequencies may be used in other examples.

A command signal, CMD is received by a flip-flop 215. The flip-flop 215 is clocked with the LCK signal. The command signal is delayed by the flip-flop 215 and output at node 235 one cycle of the LCK after receipt. A FIFO 230 is coupled to the node 235 and configured to store phase information associated with the CMD signal. For example, the FIFO 230 may be configured to identify whether the CMD was received during a first portion of the HCK signal, or a second portion of the HCK signal and store the identified phase information. The command signal is coupled to a command lengthener that lengthens the command signal for use with the HCK signal. Accordingly, the length of the command signal may be doubled by the command lengthener 240. The lengthened command may be coupled to the reduced clock flip-flop pipeline 205 and delayed through a series of flip-flops clocked with the HCK signal. The FIFO 230 is coupled to an output of the reduced clock flip-flop pipeline 205 such that when a command is output from the pipeline 205, associated stored phase information may be coupled to the phase combiner 235. The phase combiner 235 receives the delayed command signal and outputs an output command signal during a cycle of the LCK signal specified by the stored phase information. In this manner, fewer flip-flop stages may be necessary to delay a command in a particular number of LCK cycles.

Figure 3:
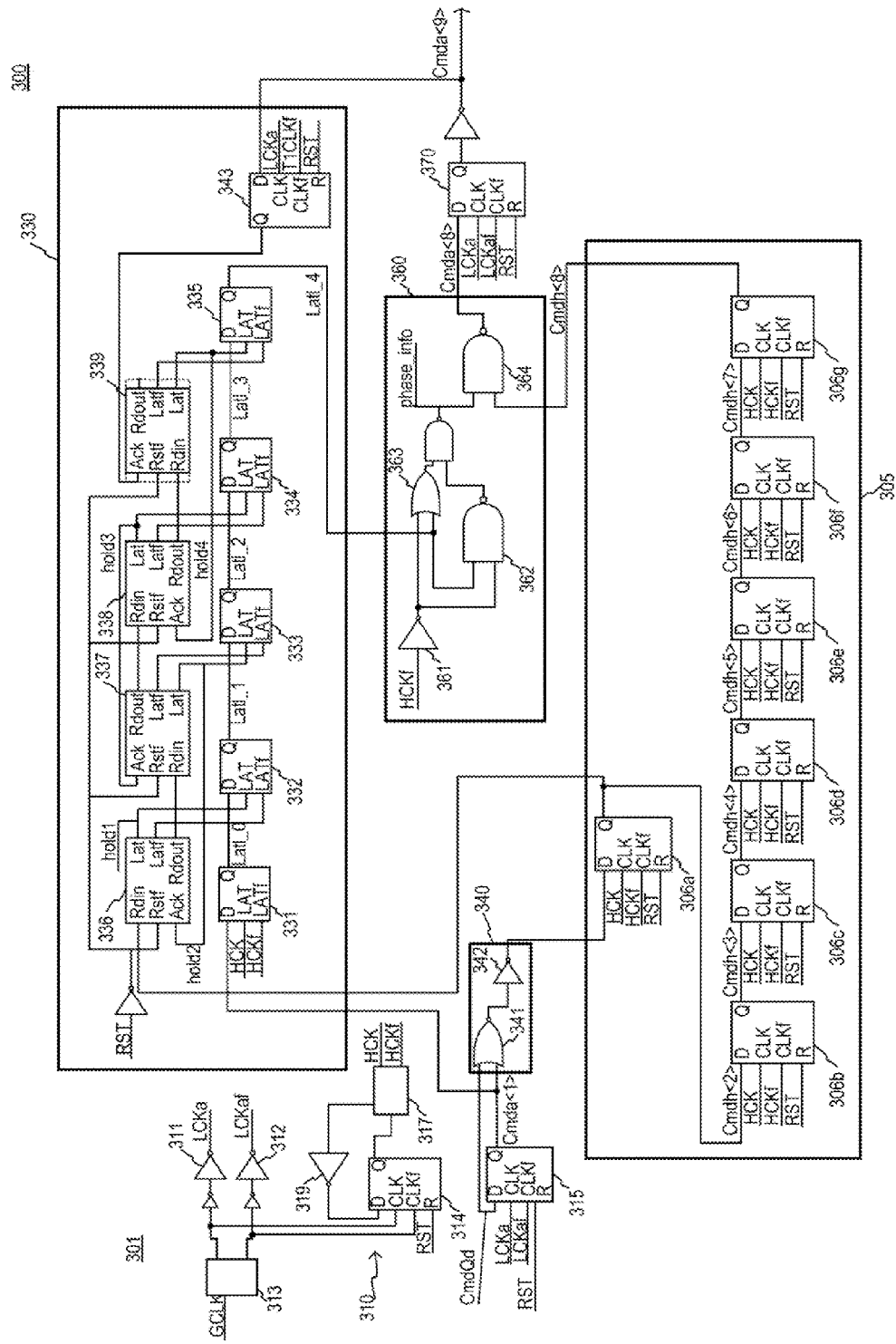
FIG. 3 is a schematic illustration of a command latency system according to another embodiment of the present invention
Figure 4:
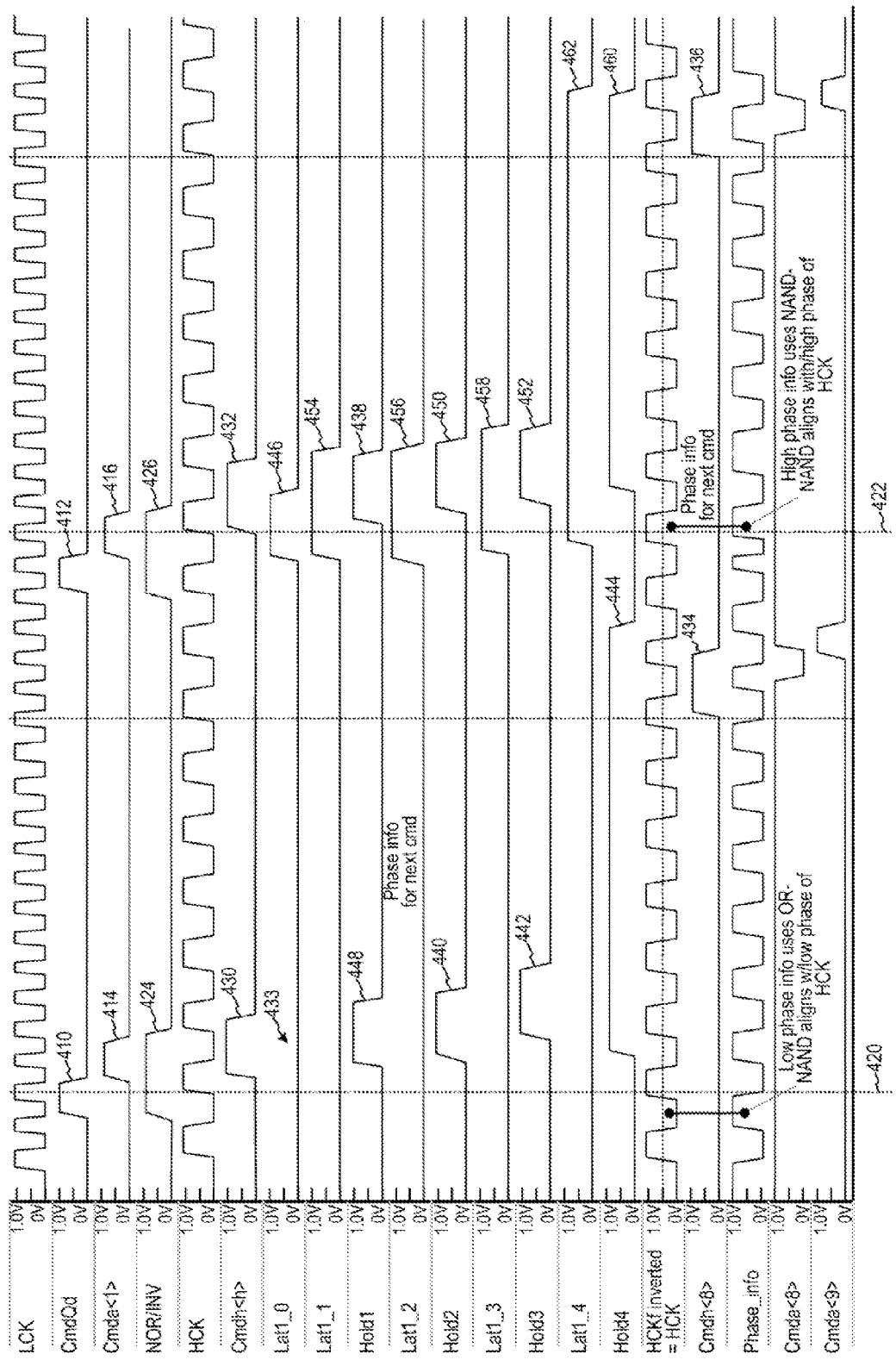
FIG. 4 is a timing diagram for use in understanding the operation of the command latency system of FIG. 3.

The components shown in FIG. 2 may be implemented in a variety of ways. Another example of a command latency system 300 is shown in FIG. 3. Operation of the command latency system 300 will now be described also with reference to the timing diagram of FIG. 4. Circuitry 301 is shown in FIG. 3 for generating complementary local clock signals LCKa and LCKaf, as well as divided complementary clock signals HCK and HCKf. A complementary signal generator 313 receives global clock signal GCLK, and outputs complementary GCLK signals to generate complementary local clock signals LCKa and LCKaf. The LCK signal is shown in FIG. 4. Referring back to FIG. 3, the complementary global clock signals are coupled to the clock divider 310 including a flip-flop 314 coupled to an inverter 319. The inverter 319 is coupled between the Q and D nodes of the flip-flop 314, as shown, such that the output of the flip-flop 314 may be a signal having ½ the frequency of the input. A complementary signal generator 317 may then generate the complementary clock signals HCK and HCKf, having ½ the frequency of the LCK signals. The HCK signal is shown in FIG. 4, and can be seen to have ½ the frequency of the LCK signal. In other embodiments, other clock divider circuitry may be used to generate the HCK signal.

Referring again to FIG. 3, a command signal, CmdQd, may be coupled to a flip-flop 315 which is clocked by the local clock signal LCK. An example of the CmdQd signal is shown in FIG. 4 for the purposes of illustration. In operation, the CmdQd signal may correspond to memory commands generated by a memory controller. Different memory systems may have different specifications regarding the allowable frequency of memory commands, such as a new memory command may be received once every four clock cycles, or the like. Accordingly, embodiments of the present invention may be used to receive command signals that arrive every four clock cycles, or with other possible frequency. However, in FIG. 4, two examples of command signals are shown to illustrate the operation of the pipeline system 300 of FIG. 3. In particular, two CmdQd pulses 410 and 412 are shown in FIG. 4, and they are spaced further apart than may occur in some operational examples for the ease of illustrating how the individual pulses are processed by the system 300. As will be described further below, the two pulses 410 and 412 occur during different phases of the LCK signal, for the purposes of illustrating operation of the system 300.

Referring again to FIG. 3, the flip-flop 315 outputs a signal Cmda<1>, a delayed version of the CmdQd signal. Accordingly, in FIG. 4, the Cmda<1> signal can be seen to have two pulses 414 and 416, corresponding to the pulses 410 and 412. Note that at the time marker 420 in FIG. 4 it can be seen that, for the pulse 414, Cmda<1> is low at the time HCK rises. However, for the pulse 416, at time marker 422, Cmda<1> is high at the time HCK rises. This difference illustrates the difference in phase of the signals, one having been received at an 'even' cycle of the LCK signal and one at an 'odd' cycle. Phase information will be discussed further below.

Referring back to FIG. 3, the CmdQd and Cmda<1> signals are coupled to a command lengthener 340. The command lengthener 340 includes a NOR gate 341 coupled to an inverter 342. As was generally described above, the command lengthener lengthens the data pulses in the CmdQd signal. This can be seen since the output of the NOR gate 341 will be low whenever either the CmdQd signal, the Cmda<1> signal, or both are high. Since the Cmda<1> signal is a delayed version of the CmdQd signal, the result is a lengthened low pulse relative to the initial CmdQd high pulse. The inverter 342 inverts the NOR output, providing a corresponding lengthened high pulse. The output of the inverter 342 is shown in FIG. 4 as 'NOR/INV' and illustrates lengthened high pulses 424 and 426.

Referring again to FIG. 3, the output of the command lengthener 340 is coupled to a reduced clock flip-flop pipeline 305. The reduced clock flip-flop pipeline 305 includes seven flip-flops 306a-g coupled in series and clocked by the HCK signal, described above. The lengthened command signal is coupled to the flip-flop 306a, and is propagated through the series of flip-flops 306a-g on successive HCK cycles. Each of the flip-flops 306a-g may be implemented using well-known circuitry, such as, but not limited to, cross-coupled inverters. The output of the flip-flop 306a is designated Cmdh<2> in FIG. 3, and is coupled to the input of the next flip-flop, 306b. The command signal Cmdh<8> is output from the last flip-flop 306g. Although seven flip-flops are shown in FIG. 3, any number may generally be used, in accordance with a specified delay amount. Referring now to FIG. 4, the Cmdh<2> signal is shown. Note that the Cmdh<2> pulses 430 and 432, corresponding to the CmdQd pulses 410 and 412 respectively, are identical, despite the phase difference in the pulses 410 and 412 relative to the LCK signal, as described above. The Cmdh<8> signal is also shown in FIG. 4, having pulses 434 and 436 corresponding to the pulses 430 and 432, respectively, delayed six cycles of HCK. As described generally above with reference to FIG. 2, the system 300 of FIG. 3 utilizes a FIFO memory to store phase information, and a phase combiner to combine the stored phase information with the delayed command signal, which will now be described further below.

A FIFO memory 330 is provided to store phase information from the CmdQd signal, as was generally described above. A variety of FIFO implementations may be used, and the implementation shown in FIG. 3 will now be described with reference to timing signals in FIG. 4. Recall, with reference to FIG. 4, that the Cmda<1> signal can be seen to have two pulses 414 and 416 having different phases in that, for the pulse 414, Cmda<1> is low at the time HCK rises, however, for the pulse 416, at time marker 422, Cmda<1> is high at the time HCK rises. Recall also, the command signal at the output of the command lengthener, pulses 430 and 432 may be identical despite the phase differences of the original Cmda<1> signal. The phase information may be stored in the FIFO for later combination with a delayed command signal.

The FIFO 330 includes latches 331-335 configured to store phase information corresponding to the Cmda<1> signal and latches 336-339 and 343 coupled to the latches 331-335 as shown to control the progression of stored information through the FIFO 330. Generally, phase information of the Cmda<1> signal is received by the latch 331, and passes through the latches 332-335 until it is output from the latch 335 in time to be combined with the delayed version of the Cmda<1> signal output as Cmdh<8> from the flip-flop 306g. Detailed operation of the FIFO 330 will now be described, although it should be understood that other FIFO implementations may also be used.

The Cmda<1> signal is input to the latch 331, which is clocked by the HCK signal. Accordingly, referring to FIG. 4, on receipt of the Cmda<1> pulse 414, which is low when the HCK signal transitions high, as described above, a low state is recorded and output from the latch 331, as indicated by the low state of the lat1_0 signal at the time 420. In contrast, on receipt of the Cmda<1> pulse 416, which is high when the HCK signal transitions high, a high state is recorded and output from the latch 331, as indicated by the high state of the lat1_0 signal at the time 422. Accordingly, when a Cmda<1> signal is received on an 'even' LCK cycle such that the Cmda<1> signal is low as HCK transitions high, the phase information recorded is a low state. When a Cmda<1> signal is received on an 'odd' LCK cycle such that the Cmda<1> signal is high as HCK transitions high, the phase information recorded is a high state. In this example, there are two phase states corresponding to the HCK signal having ½ the frequency of the LCK signal. In other embodiments, there may be a greater number of possible states, such as four when the HCK signal has ¼ the frequency of the LCK signal.

Referring back to FIG. 3, the latches 336-339 and 343 control the propagation of stored phase information through the latches 331-335. Generally, stored phase information is passed through the latches 331-335 to the furthest available latch, where it is held. As commands are output from the system 300, shown as Cmda<9>, the latch 343 provides a signal to an acknowledge node of the latches 336-339, such that the appropriate hold1, hold2, hold3, and hold4 signals may be output by the latches 336-339 to propagate the stored information in the latches 331-335 to a next available latch, and ultimately output to the phase combiner 360. In the example of FIG. 4, the latches 331-335 are empty on receipt of the respective Cmda<1> pulses 414 and 416. Recall the latch 331 outputs the lat1_0 signal, which contains an indication of phase, low (at the time 420, indicated by 433 of FIG. 4, corresponding to the pulse 414, and high corresponding to the pulse 416 (as shown by the pulse 446). Since the latches 331-335 of FIG. 3 are initially empty, the phase passes through the latches 331-335. The Cmdh<2> signal is coupled to the input of the latch 336, and passes through the latches 336-339 as intermediate signals hold1, hold2 and hold3, respectively. Accordingly, responsive to the Cmdh<2> pulse 430 of FIG. 4, the hold1, hold2, hold3, and hold4 signals exhibit pulses 448, 440, and 442. The low phase information state as illustrated by the absence of a pulse at 433 is propagated through the latches 332-334 as shown by the low signals on lat1_1_, lat1_2, and lat 1_3, respectively. The hold4 signal is high from a time responsive to receipt of the Cmdh<2> signal by the FIFO 330 through an end of the delayed command signal, the Cmdh<8> signal, as shown by pulse 444 in FIG. 4, to retain the stored phase information at an output of the latch 335, the lat1_4 signal. In this manner, the stored phase information is stored and may be available for later combination with the delayed command signal. While only a single command pulse at a time is shown propagating through the FIFO in FIG. 4, it is to be understood that while phase information is held by the lat1_4 signal, phase information corresponding to subsequent received command pulses may be stored in the other latches. While the FIFO of FIG. 3 is shown as five latches deep, generally any depth of FIFO may be used in accordance with an expected frequency of command pulses and delay of the reduced clock flip-flop pipeline 305.

Referring again to FIG. 4, a similar process may be observed on receipt of the pulse 432. The hold1, hold2, and hold3 signals exhibit pulses 438, 450, and 452. The high phase information state as illustrated by the pulses 454, 456, and 458 is propagated through the latches 332-334 as shown by the low signals on lat1_1_, lat1_2, and lat 1_3, respectively. The hold4 signal is high from a time responsive to receipt of the Cmdh<2> signal by the FIFO 330 through an end of the delayed command signal, the Cmdh<8> signal, as shown by pulse 460 in FIG. 4, to retain the stored phase information at an output of the latch 335, the lat1_4 signal, as shown by the pulse 452. In this manner, the stored phase information is stored and may be available for later combination with the delayed command signal. While only a single command pulse at a time is shown propagating through the FIFO in FIG. 4, it is to be understood that while phase information is held by the lat1_4 signal, phase information corresponding to subsequent received command pulses may be stored in the other latches.

As described above, phase information relating the received command signal to a cycle of the LCK signal may be stored in the FIFO 330 of FIG. 3 as the command signal is delayed in the reduced clock flip-flop pipeline 305. The combination of the stored phase information with the delayed command signal will now be described with reference to FIGS. 3 and 4 and the operation of the phase combiner 360. Generally, the phase combiner 360 receives the delayed command signal Cmdh<8> from the reduced clock flip-flop pipeline 305 and the lat1_4 signal from the FIFO 330, corresponding to phase information for the delayed command signal Cmdh<8>, and generates the Cmda<8> signal having a pulse corresponding to a cycle of the LCK corresponding to the stored phase information. The phase combiner includes an inverter 361 to invert the complementary HCK signal, HCKf, to yield the HCK signal, shown in FIG. 4. The lat1_4 signal is coupled to a NAND gate 362 and an OR-NAND gate 363. When the lat1_4 signal is low (such as responsive to the Cmda<1> pulse 414 of FIG. 4), the output of the NAND gate 362 may always be high, such that the HCK signal is propagated through the OR-NAND gate 363 such that the output signal (labeled 'phase_info' in FIGS. 3 and 4) transitions high responsive to a low of the HCK signal. Conversely, when the lat1_4 signal is high, the output of the OR function of the OR-NAND gate 363 may always be high and the HCK signal propagated through NAND gate 362 such that the phase_info signal transitions high responsive to a high of the HCK signal. The different alignment of the phase_info signal based on the stored phase information may be seen in FIG. 4. The phase_info signal and the Cmdh<8> signal may be input to a NAND gate 364 to generate the Cmda<8> signal with pulses having a width corresponding to a high period of the phase_info signal and occurring during a cycle of the phase_info signal indicated by the phase information, as can be seen in FIG. 4.

The Cmda<8> signal is input into a flip-flop 370 clocked by the LCK signal and the output inverted to generate the Cmda<9> signal. The Cmda<9> signal accordingly represents a latency of 15 LCK cycles relative to the Cmda<1> signal and may be applied to a memory array. The Cmda<9> signal, as shown in FIG. 3, is further coupled to the latch 343 of the FIFO 330 to provide an acknowledge signal to the latch 339 releasing signal hold4 such that stored phase, information may be propagated through the FIFO 330. In this manner, the specified latency may be achieved using fewer flip-flop stages than had a single flip-flop stage been used for each LCK cycle of delay. Reducing the number of flip-flop stages may also save current consumption, and therefore power.

A description of an embodiment of a command latency system has been provided above. The pipeline system generally delays a command signal through a reduced clock flip-flop pipeline using a clock operating at a lower frequency than a local clock used to capture the command signal. A phase of the command signal is stored and recombined with the delayed command signal to generate an output command signal that may be applied to a memory array. Variations of the system described with reference to FIGS. 3 and 4 may be used in other embodiments.

Figure 5:
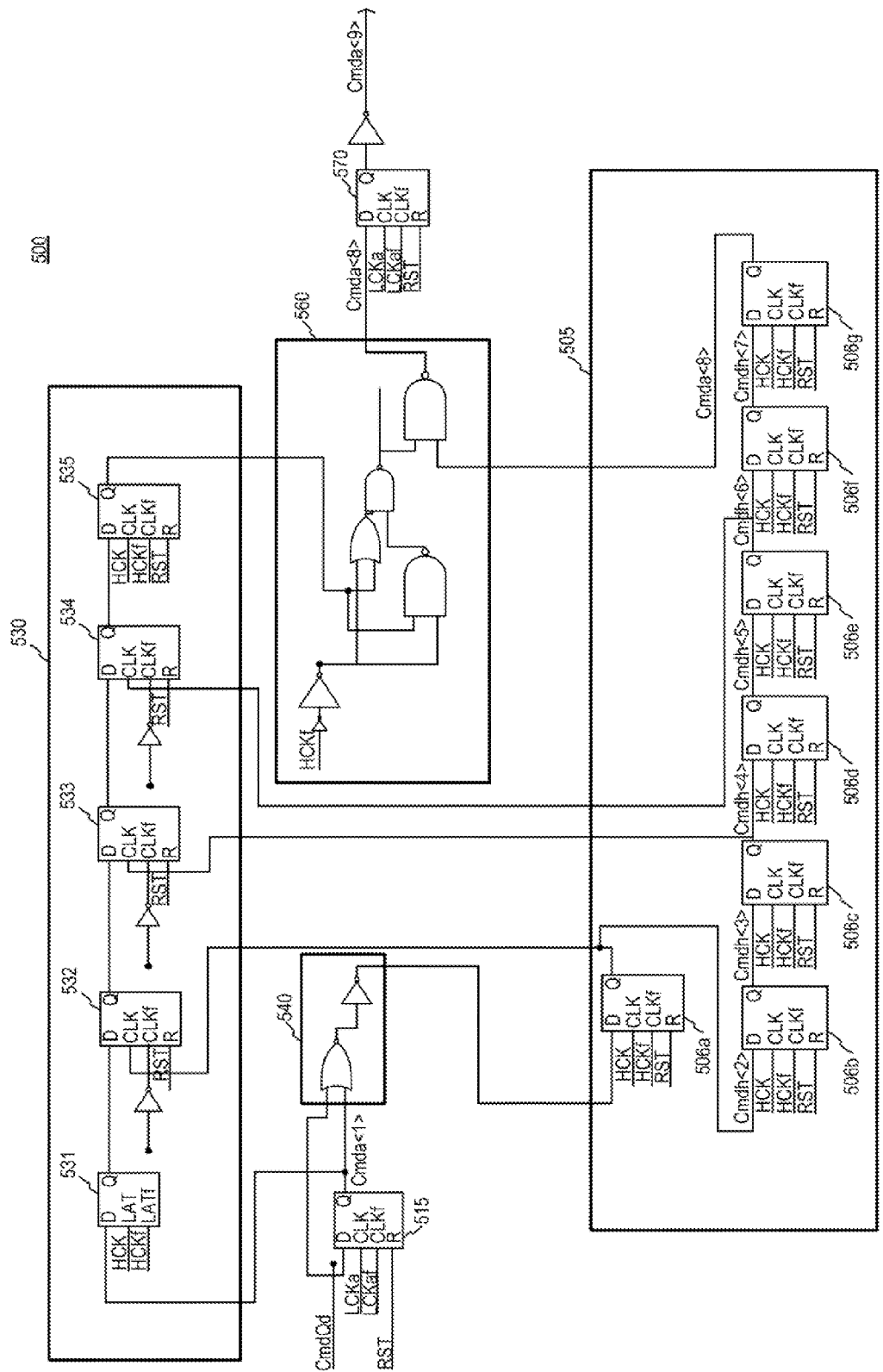
FIG. 5 is a schematic illustration of a command latency system according to another embodiment of the present invention.

FIG. 5 depicts a command latency system 500 that utilizes a series of flip-flops, instead of a FIFO, to store phase information of the command signal. The command latency system 500 includes a flip-flop 515, a command lengthener 540, a reduced clock flip-flop pipeline 505 having flip-flops 506a-g, a phase combiner 560, and a flip-flop 570. These components have analogous operation to those described above with reference to FIG. 3. However, the command latency system 500 includes a series of flip-flops 530 to store phase information. A latch 531 receives the Cmda<1> signal and is clocked with the HCK signal. Accordingly, the latch 531 may output a delayed Cmda<1> signal. The output of the latch 531 is coupled to a flip-flop 532, clocked by the Cmdh<2> signal that is output from the latch 506a. In this manner, the latched version of the Cmda<1> signal may be output from the flip-flop 532 responsive to receipt of the Cmdh<2> signal. The output of the flip-flop 532 is coupled to the flip-flop 533, which is clocked by the Cmdh<4> signal. Accordingly, the latched version of the Cmda<1> signal may be output from the flip-flop 533 responsive to receipt of the Cmdh<4> signal. The output of the flip-flop 533 is coupled to the flip-flop 534, clocked by the Cmdh<6> signal such that the latched version of the Cmda<1> signal may be output from the flip-flop 534 responsive to receipt of the Cmdh<6> signal. The output of the flip-flop 534 is coupled to the flip-flop 535 and clocked by the HCK signal, such that the latched version of the Cmda<1> signal is output from the flip-flop 535 responsive to receipt of a HCK pulse, and coupled to the phase combiner. By propagating the Cmda<1> signal, which is not lengthened by the command lengthener 540, through the flip-flop pipeline, the appropriate phase information is retained. Accordingly, an embodiment has been described using a series of flip-flops, rather than a FIFO, to store phase information in a command latency system.

Figure 6:
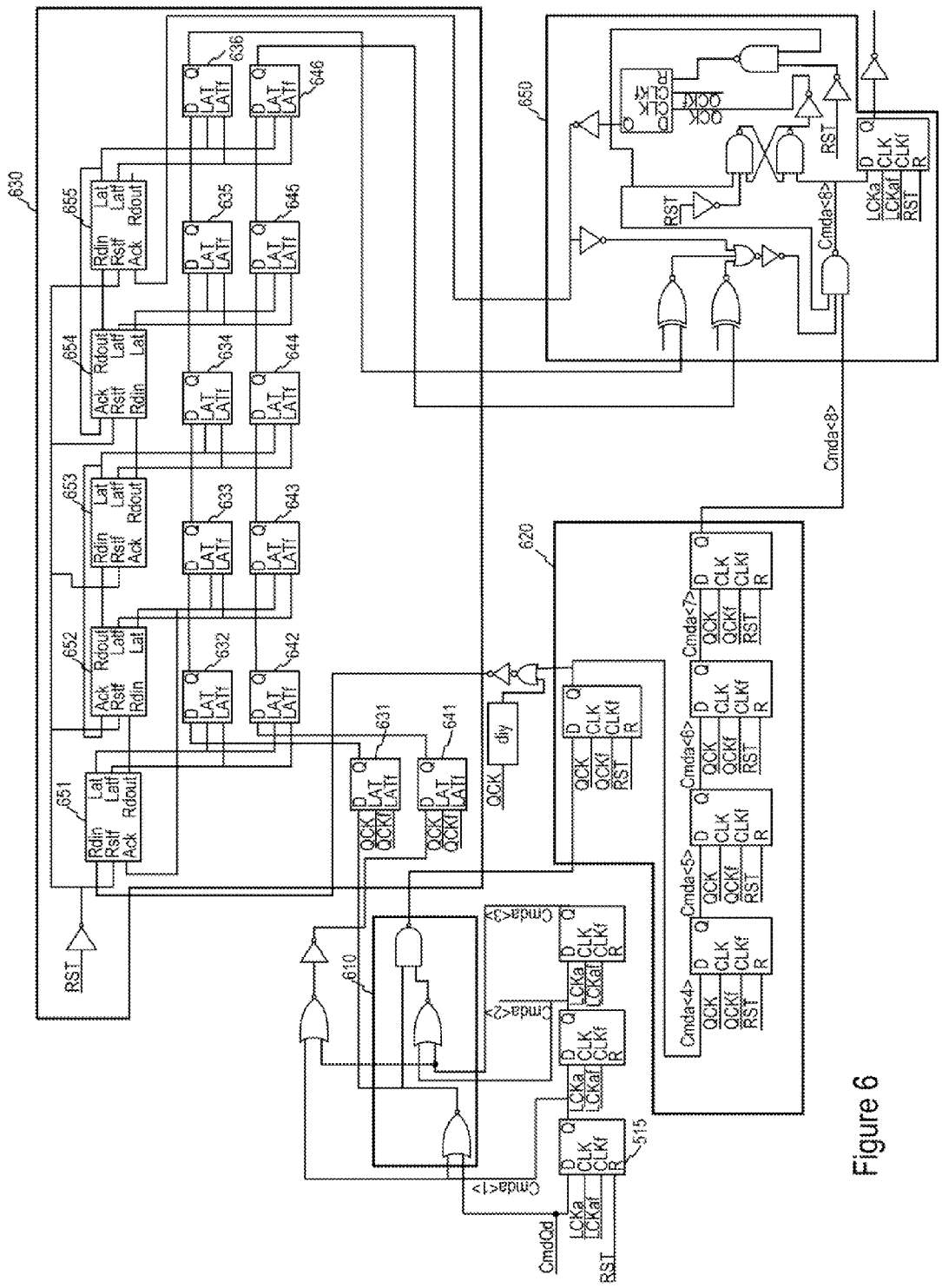
FIG. 6 is a schematic illustration of a command latency system according to another embodiment of the present invention.

FIG. 6 depicts another embodiment of a command latency system according to the present invention. The system of FIG. 6 utilizes a quarter-clock signal, QCK, having ¼ the frequency of the local clock signal LCK. A command lengthener 610 lengthens a received command signal, and the lengthened command signal is coupled to a reduced clock flip-flop pipeline 620 with flip-flops clocked using the QCK signal. A FIFO 630 stores two bits of phase information for each received command signal, as shown by the use of two rows of latches—a first row 631-635 stores a first bit of phase information, while a second row 641-646 stores a second bit. As described above, the latches 631-635 and 641-646 are controlled by a third set of latches 651-655. Note that, by utilizing a quarter clock signal, a number of flip-flops in the pipeline 620 may be further reduced, down to five in FIG. 6, since each flip-flop holds the command signal for a longer period of time. A phase combiner 650 decodes the two bits of phase information to generate an output command signal during an appropriate cycle of the LCK signal. Variations on the FIFO 630 may be used. As generally described above with regard to FIG. 5, a series of flip-flops may be used instead of the FIFO 630 to store phase information. In the quarter-clock system of FIG. 6, two rows of flip-flops may be used to propagate two bits of phase information. Further, generally any type of FIFO may be used, including, but not limited to, a ring controlled FIFO.

Figure 7:
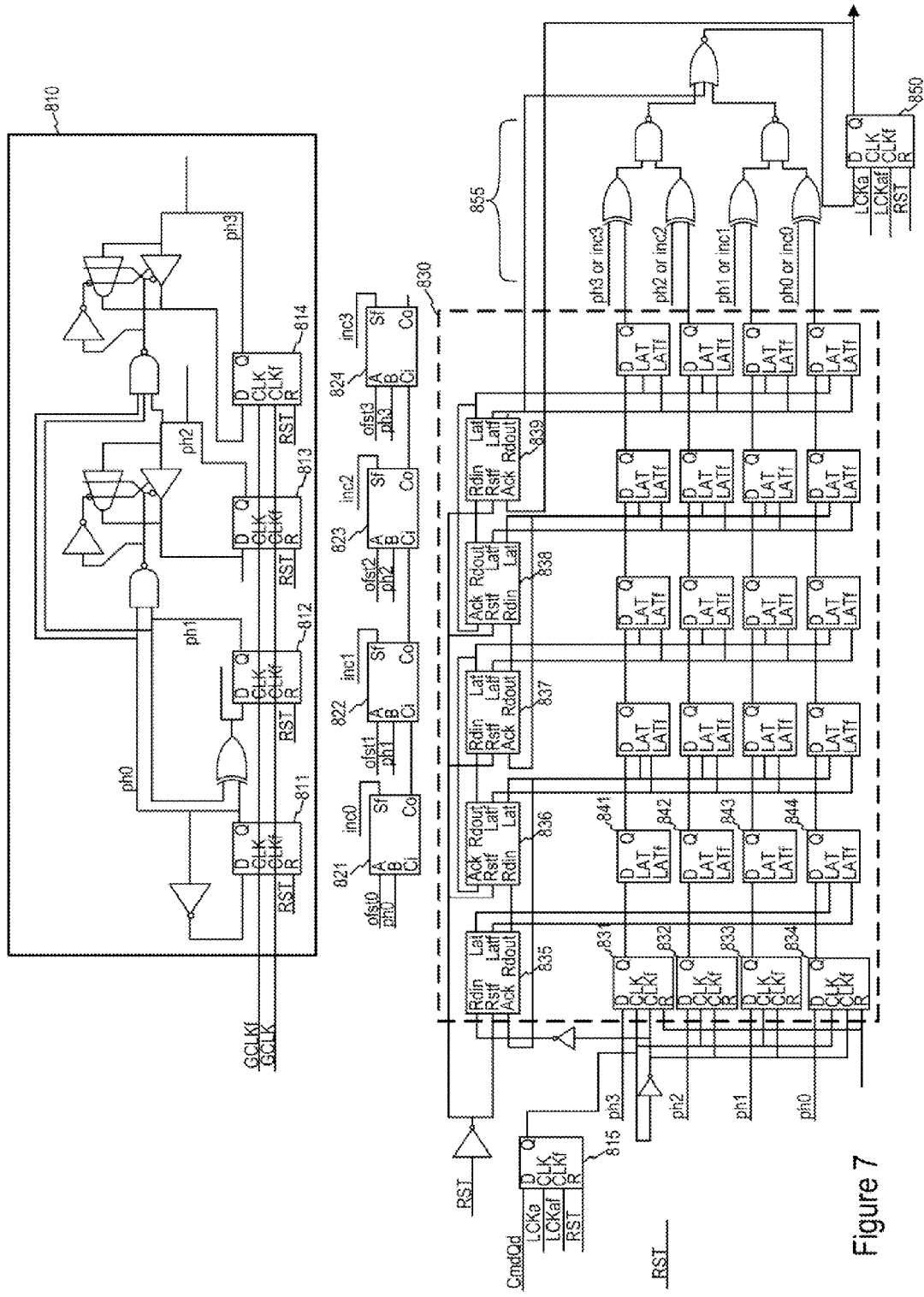
FIG. 7 is a schematic illustration of a command latency system according to another embodiment of the present invention.

FIG. 7 depicts another embodiment of a command latency system. In the embodiment shown in FIG. 7, a slower clock signal may not be needed to reduce a number of flip-flops through which the command signal is propagated to generate a particular amount of command latency. Instead, a clock signal, GCLK in FIG. 7, is coupled to a counter 810. The counter 810 is shown in FIG. 7 implemented as a look-ahead counter, however, any other counter implementation may be used, including but not limited to a ripple counter. In some embodiments, the look-ahead counter, however, may be able to accommodate a faster clock signal.

The counter 810 cycles through a set of states in the flip-flops 811-814. The counter 810 accordingly has 16 states, and the state is incremented each cycle of the GCLK signal. The state of the counter 810 accordingly is stored in the flip-flops 811-814 and may be output from the counter 810 as the signals ph0, ph1, ph2, and ph3, as shown in FIG. 7.

A command signal, CmdQd, may be coupled to a first flip-flop 815 clocked by a local clock signal LCK having the same frequency as the global clock signal GCLK. The CmdQd signal may then be coupled to a FIFO 830, at the clock inputs of the flip-flops 831-834. The flip-flops 831-834 may receive the ph0,ph1,ph2, and ph3 signals at their respective data inputs, as shown. Accordingly, the flip-flops 831-834 latch the state of the counter 810 responsive to receipt of a command signal. The latches 835-839 are coupled to other latches in the FIFO, as shown, to propagate stored states of the counter through the FIFO. As shown, each storage position in the FIFO has four latches (such as the latches 841-844) to store a corresponding four bits of counter state information. If the counter 810 had a greater or fewer number of states, the number of latches in each storage position in the FIFO may be different. As shown, the FIFO 830 may store five counter states, corresponding to five different received commands. Deeper or shallower FIFOs may be used in accordance with a number of commands anticipated and command latency used. The latches 835-839 control movement of the stored state information through the FIFO 830, as has generally been described above with reference for example to FIG. 3 and the movement of phase information through the latches 331-334.

A pulse is output from the FIFO and coupled to a flip-flop 850 responsive to an indication from the counter 810 that a particular number of clock cycles have elapsed. For example, the counter 810 has 16 states and the FIFO 830 may be configured to output a command pulse 16 clock cycles following receipt of the command signal. Accordingly, the ph0, ph1, ph2, and ph3 signals are coupled to logic 855, as are the last stored state from the FIFO 830. The logic 855 is configured such that when the stored state matches the state reflected by the ph0,ph1,ph2, and ph3 signals, a command pulse is coupled to the flip-flop 850. Accordingly, for example, if a CmdQd signal is received when the counter 810 reflects the state '0001', the '0001' state is latched in the FIFO 830, and propagated through the FIFO. When the counter 810 next reaches the state '0001', a command pulse is coupled to the flip-flop 850, and output as Cmda<9>, as shown. In this manner, a number of states of the counter 810 is related to the command latency achieved by the system. In the example just described, the Cmda<8> signal is delayed a number of clock cycles equal to a number of states of the counter 810.

In other examples, however, the delay in the FIFO may be different than the number of states of the counter 810. full adders 821, 822, 823, and 824 may be provided that receive offset signals ofst0, ofst1, ofst2, and ofst3, respectively and the ph0, ph1, ph2, and ph3 signals, as shown. The full adders 821-824 add a number of states based on the respective ofst signals, and output the resultant inc0, inc1, inc2, and inc3 signals. In this manner, a state is output from the full adders 821-824 that is several states ahead of the state reflected in the counter flip-flops 811-814. The inc0, inc1, inc2, and inc3 signals may then be coupled to the logic 855 instead of the ph0, ph1, ph2, and ph3 signals, as indicated in FIG. 7. In this manner, the ofst signals combined with the number of states of the counter 810 may determine the number of clock cycles a command signal is delayed in the FIFO 830. Command signals may accordingly be delayed using the system of FIG. 7 between about 4 and 18 clock cycles. By delaying command signals utilizing stored phase information in the FIFO 830, the command signals need not be propagated through a number of flip-flops equal to the desired command latency. Instead, fewer flip-flops may be used and the output of a command pulse controlled by the FIFO 830 and the counter 810, as generally described above.

Figure 8:
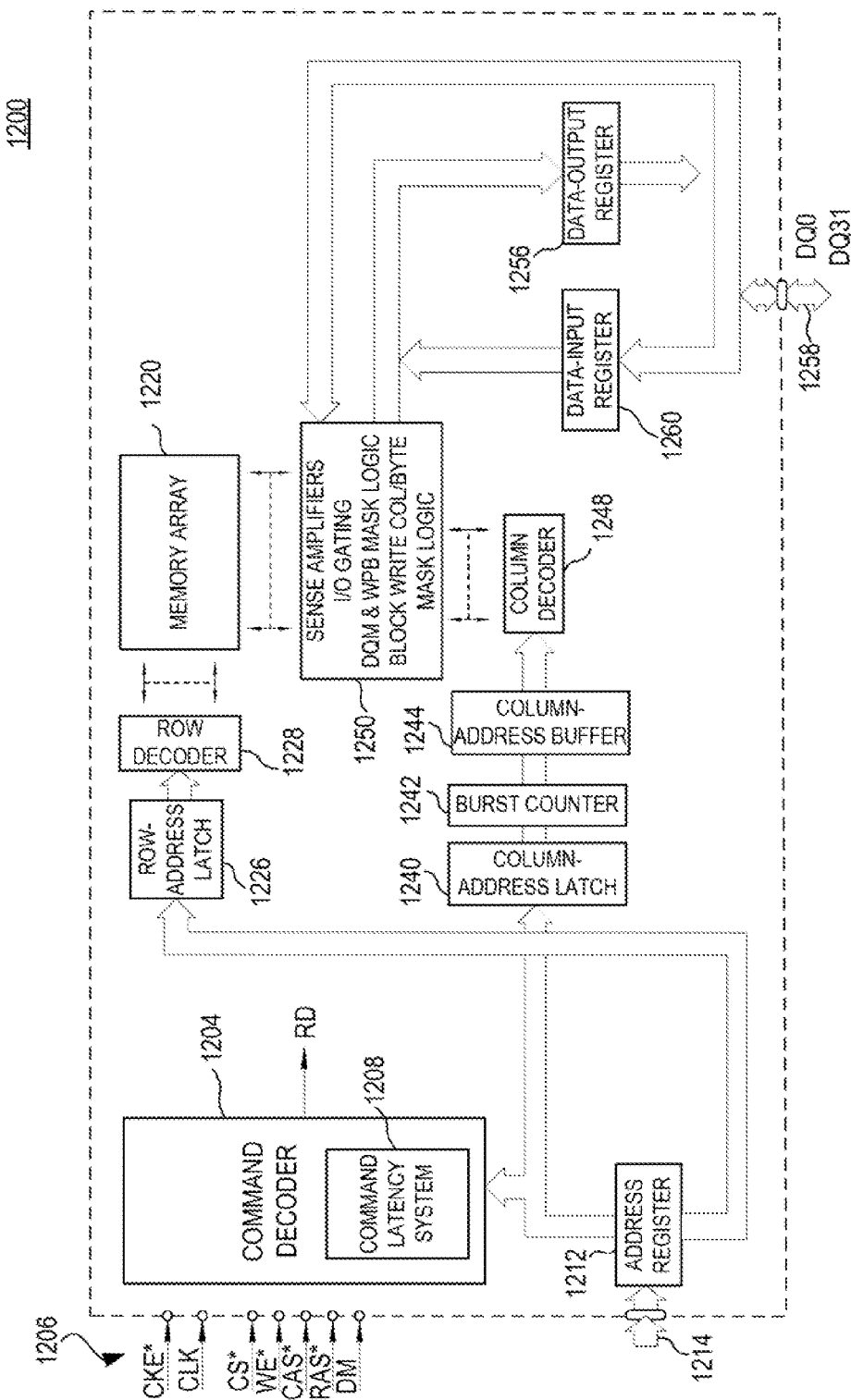
FIG. 8 is a schematic illustration of a memory system according to an embodiment of the present invention.

Various embodiments of the command latency system can be used in virtually any memory device in which a command latency is possible, including dynamic random access memory ("DRAM") devices, flash memory devices, and static random access memory ("SRAM") devices, to name a few. For example, as shown in FIG. 8, a conventional synchronous dynamic random access memory ("SDRAM") 1200 may use various embodiments of a command latency system. The operation of the SDRAM 1200 is controlled by a command decoder 1204 responsive to high-level command signals received on a control bus 1206. The command decoder 1204 generates a sequence of command signals responsive to the high level command signals to carry out the function (e.g., a read or a write) designated by each of the high level command signals. These command signals include the RD signal, which transitions active high at the start of read operations. The command latency system 1208 may delay a command before applying the command to a memory array, as has been described above.

The SDRAM 1200 includes an address register 1212 that may receive row addresses and column addresses through an address bus 1214. The address bus 1214 may generally be coupled to a memory controller (not shown in FIG. 8). A row address is generally first received by the address register 1212 and coupled to a number of components associated with a memory array 1220. Associated with the memory array 1220 is a respective row address latch 1226, which stores the row address, and a row decoder 1228, which decodes the row address and applies corresponding signals to the array 1220.

After the row address has been applied to the address register 1212 and stored in one of the row address latches 1226, a column address may be applied to the address register 1212. The address register 1212 couples the column address to a column address latch 1240. Depending on the operating mode of the SDRAM 1200, the column address may either be coupled through a burst counter 1242 to a column address buffer 1244, or to the burst counter 1242, which applies a sequence of column addresses to the column address buffer 1244 starting at the column address output by the address register 1212. In either case, the column address buffer 1244 applies a column address to a column decoder 1248.

Data to be read from the arrays 1220 is coupled to column circuitry 1250, which may include for example, sense amplifiers and I/O gating for the array 1220. The data bits developed by the sense amplifiers may then be coupled to a data output register 1256. Data to be written to the array 1220 may be coupled from the data bus 1258 through a data input register 1260. The write data may be coupled to the column circuitry 1250 where they may be transferred to the array 1220.

The memory device shown in FIG. 6 may be implemented in any of a variety of products employing processors and memory including for example cameras, phones, wireless devices, displays, chip sets, set top boxes, gaming systems, vehicles, and appliances. Resulting devices employing the memory system may benefit from the embodiments of a command latency system described above to perform their ultimate user function.

From the foregoing it will be appreciated that, although specific embodiments of the invention have been described herein for purposes of illustration, various modifications may be made without deviating from the spirit and scope of the invention.

What is claimed is:

1. An apparatus, comprising:
a delay circuit configured to receive a first command signal and delay the first command signal based, at least in part, on first and second clock signals to provide a delayed command signal; and
an output flip-flop configured to provide a second command signal in accordance with the first clock signal, the second command signal based, at least in pan, on the delayed command signal and phase information indicating a cycle of the first clock signal corresponding to receipt of the first command signal by the delay circuit.

2. The apparatus of claim 1, wherein the delay circuit is further configured to lengthen the command signal.

3. The apparatus of claim 1, wherein the second clock signal is based, at least in part, on the first clock signal.

4. The apparatus of claim 1, further comprising storage circuitry configured to receive the second command signal and provide the phase information responsive, at least in part, to cycling through a plurality of states.

5. The apparatus of claim 4, wherein the storage circuitry comprises a flip-flop pipeline.

6. The apparatus of claim 1, wherein the apparatus is included in a memory.

7. The apparatus of claim 1, wherein the delay circuit comprises a first number of flip-flops and wherein the delay circuit is configured to delay the first command signal by a second number of cycles of the first clock signal, the second number greater than the first number.

8. An apparatus, comprising:
a delay circuit configured to delay an input command signal based, at least in part, on a first clock signal to provide a delayed command signal and further configured to delay the delayed command signal based, at least in part, on a second clock signal to provide a lengthened command signal; and
a phase combiner coupled to the delay circuit and configured to receive the lengthened command signal and provide an output command signal based, at least in part, on the lengthened command signal and phase information associated with first clock signal.

9. The apparatus of claim 8, further comprising storage circuitry configured to receive the command signal and store a state responsive, at least in part, to receipt of the command signal.

10. The apparatus of claim 9, wherein the storage circuitry is further configured to provide the phase information responsive, at least in part, to the stored state matching a current state of the storage circuitry.

11. The apparatus of claim 8, wherein the delay circuit is configured to delay the delayed command signal by a first number of cycles of the first clock signal using a second number of flip-flops, the first number greater than the second number.

12. The apparatus of claim 8, wherein the phase information is associated with a cycle of the first clock signal.

13. The apparatus of claim 12, wherein the phase combiner is further configured to provide the output command signal during the cycle of the first clock signal.

14. A method, comprising:
receiving a first command signal during a cycle of a first clock signal,
delaying a first command signal with a delay circuit based, at least in part, on the first clock signal and a second clock signal to provide a delayed command signal;
providing phase information indicating the cycle of the first clock signal; and
combining the delayed command signal and the phase information to provide a second command signal.

15. The method of claim 14, further comprising:
storing the phase information in a memory.

16. The method of claim 15, wherein storing the phase information in a memory comprises cycling through a plurality of states of a counter.

17. The method of claim 14, wherein the cycle of the first clock signal is a first cycle, the method further comprising:
decoding the phase information during a second cycle of the first clock signal.

18. The method of claim 14, wherein delaying a first command signal with a delay circuit based, at least in part, on the first clock signal and a second clock signal to provide a delayed command signal comprises lengthening the first command signal.

19. The method of claim 14, wherein delaying a first command signal with a delay circuit based, at least in part, on the first clock signal and a second clock signal to provide a delayed command signal comprises propagating the first command signal through a flip-flop pipeline.

20. The method of claim 14, further comprising:
dividing the first clock signal using a clock divider to provide the second clock signal.

* * * * *

UNITED STATES PATENT AND TRADEMARK OFFICE
CERTIFICATE OF CORRECTION

PATENT NO. : 8,773,928 B2  Page 1 of 1
APPLICATION NO. : 13/915351
DATED : July 8, 2014
INVENTOR(S) : Donald M. Morgan It is certified that error appears in the above-identified patent and that said Letters Patent is hereby corrected as shown below:

In the Claims

In column 11, line 9, in Claim 1, delete "pan," and insert -- part, --, therefor.

In column 12, line 16, in Claim 14, delete "signal," and insert -- signal; --, therefor.

Signed and Sealed this
Thirteenth Day of January, 2015

Michelle K. Lee
*Deputy Director of the United States Patent and Trademark Office*